(12) United States Patent
Lee et al.

(10) Patent No.: US 12,069,913 B2
(45) Date of Patent: Aug. 20, 2024

(54) DISPLAY DEVICE

(71) Applicant: Samsung Display Co., LTD., Yongin-si (KR)

(72) Inventors: Yu Jin Lee, Cheonan-si (KR); Tae Hui Kim, Asan-si (KR); Yul Kyu Lee, Hwaseong-si (KR); Jung An Lee, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 394 days.

(21) Appl. No.: 17/505,020

(22) Filed: Oct. 19, 2021

(65) Prior Publication Data

US 2022/0208930 A1   Jun. 30, 2022

(30) Foreign Application Priority Data

Dec. 29, 2020   (KR) .................. 10-2020-0186317

(51) Int. Cl.
*H10K 59/131*  (2023.01)
*H10K 50/86*   (2023.01)

(52) U.S. Cl.
CPC .......... *H10K 59/131* (2023.02); *H10K 50/865* (2023.02)

(58) Field of Classification Search
CPC ............ H10K 59/131; H10K 2102/341; H01L 27/0248; H01L 23/60
See application file for complete search history.

(56) References Cited

U.S. PATENT DOCUMENTS

2020/0381505 A1 * 12/2020 Cho .................. H01L 27/1218

FOREIGN PATENT DOCUMENTS

| CN | 104393000 A | * | 3/2015 |
|---|---|---|---|
| KR | 10-2006-0077721 | | 7/2006 |
| KR | 10-2007-0060832 | | 6/2007 |
| KR | 10-2007-0065066 | | 6/2007 |
| KR | 10-2008-0070149 | | 7/2008 |
| KR | 10-2016-0084006 | | 7/2016 |
| KR | 10-2019-0048806 | | 5/2019 |

* cited by examiner

*Primary Examiner* — Zandra V Smith
*Assistant Examiner* — Evan G Clinton
(74) *Attorney, Agent, or Firm* — KILE PARK REED & HOUTTEMAN PLLC

(57) ABSTRACT

A display device includes a substrate, a first conductive layer disposed on the substrate, a first insulating layer disposed on the first conductive layer, a semiconductor layer disposed on the first insulating layer, a second insulating layer disposed on the semiconductor layer, a second conductive layer disposed on the second insulating layer and overlapping the semiconductor layer, and a third insulating layer disposed on the second conductive layer, wherein the first conductive layer includes two end portions separated by cutting a region of the first conductive layer, and the two end portions of the first conductive layer are electrically connected by a first connecting part.

19 Claims, 14 Drawing Sheets

(a)

(b)

(a) (b)

DISPLAY DEVICE

CROSS-REFERENCE TO RELATED APPLICATION(S)

This application claims priority to and the benefit of Korean Patent Application No. 10-2020-0186317 under 35 U.S.C. 119, filed in the Korean Intellectual Property Office (KIPO) on Dec. 29, 2020, the entire contents of which are incorporated herein by reference.

BACKGROUND

1. Technical Field

The disclosure relates to a display device.

2. Description of the Related Art

An emissive display device may have a self-emission characteristic, and, unlike a liquid crystal display, may not require a separate light source, so thickness and weight may be reduced. An emissive display device may exhibit high quality characteristics such as low power consumption, high luminance, and high reaction speed.

An emissive display device may include a light emitting diode (LED) including two electrodes and an emission layer disposed between the two electrodes, and when holes and electrons may be injected from the two electrodes into the emission layer, an exciton, in which the holes and electrons may be combined, may emit light when dropping from an excited state to a ground state.

An emissive display device may include pixels, and each pixel may include an organic light emitting diode and a pixel circuit for driving the organic light emitting diode. The pixel circuit may include transistors and at least one capacitor.

Static electricity may be transmitted through wirings connected to the pixel circuit of the display device, and signal lines that may be insulated from each other may be shorted by the static electricity.

The above information disclosed in this Background section is only for enhancement of understanding of the background of the disclosure, and therefore it may contain information that does not form the prior art that is already known in this country to a person of ordinary skill in the art.

SUMMARY

Embodiments may provide a display device capable of preventing a short circuit of signal lines due to static electricity.

It is apparent that aspects of the disclosure are not limited to the above-described aspect, but may be variously extended within a range without departing from the spirit and scope of the disclosure.

A display device according to an embodiment may include a substrate, a first conductive layer disposed on the substrate, a first insulating layer disposed on the first conductive layer, a semiconductor layer disposed on the first insulating layer, a second insulating layer disposed on the semiconductor layer, a second conductive layer disposed on the second insulating layer and overlapping the semiconductor layer, and a third insulating layer disposed on the second conductive layer, wherein the first conductive layer may include two end portions separated by cutting a region of the first conductive layer, and the two end portions of the first conductive layer may be electrically connected by a first connecting part.

The first conductive layer may include a data line and a light blocking pattern overlapping the semiconductor layer.

The data line may include the two end portions.

The first connecting part may be disposed on the third insulating layer, the first insulating layer, the second insulating layer, and the third insulating layer may include a first contact hole and a second contact hole overlapping the two end portions of the first conductive layer, and the first connecting part may be electrically connected to the two end portions of the first conductive layer through the first contact hole and the second contact hole.

The first connecting part may be disposed on the second insulating layer, the first insulating layer and the second insulating layer may include a first contact hole and a second contact hole overlapping the two end portions of the first conductive layer, and the first connecting part may be electrically connected to two end portions of the first conductive layer through the first contact hole and the second contact hole.

The first connecting part may include a lower layer disposed on the second insulating layer and an upper layer disposed on the third insulating layer, the first insulating layer and the second insulating layer may include a first contact hole and a second contact hole overlapping the two end portions of the first conductive layer, the lower layer of the first connecting part may be electrically connected to the two end portions of the first conductive layer through the first contact hole and the second contact hole, the third insulating layer may include a third contact hole and a fourth contact hole overlapping the two end portions of the first conductive layer, and the upper layer of the first connecting part may be electrically connected to the lower layer of the first connecting part through the third contact hole and the fourth contact hole.

The first conductive layer may include a data line, the second conductive layer may include a gate electrode overlapping the semiconductor layer and a driving voltage transmitting portion overlapping the data line and transmitting a driving voltage, and the region may be disposed between the semiconductor layer and the driving voltage transmitting portion.

The third conductive layer may further include a common voltage transmitting portion overlapping the first conductive layer and transmitting a common voltage, and the region may be disposed between the semiconductor layer and the common voltage transmitting portion.

The common voltage transmitting portion may overlap the driving voltage transmitting portion.

The first connecting part may be disposed on the third insulating layer, the first insulating layer, the second insulating layer, and the third insulating layer may include a first contact hole and a second contact hole overlapping the two end portions of the first conductive layer, and the first connecting part may be electrically connected to the two end portions of the first conductive layer through the first contact hole and the second contact hole.

The first connecting part may be disposed on the second insulating layer, the first insulating layer and the second insulating layer may include a first contact hole and a second contact hole overlapping the two end portions of the first conductive layer, and the first connecting part may be electrically connected to the two end portions of the first conductive layer through the first contact hole and the second contact hole.

The first conductive layer may further include a driving voltage line, and the driving voltage transmitting portion may be electrically connected to the driving voltage line.

The first conductive layer may further include a common voltage line, and the common voltage transmitting portion may be electrically connected to the common voltage line.

The first conductive layer may further include a driving voltage line and an initialization voltage line, the semiconductor layer may include a semiconductor layer of a driving transistor electrically connected to the driving voltage line, a semiconductor layer of a switching transistor electrically connected to the data line, and a semiconductor layer of an initialization transistor electrically connected to the initialization voltage line, and the second conductive layer may include a gate electrode of the driving transistor overlapping the semiconductor layer of the driving transistor, and a lower storage electrode extended from the gate electrode of the driving transistor and electrically connected to the semiconductor layer of the switching transistor.

A display device according to an embodiment may include a substrate including a display area and a non-display area around the display area, a first conductive layer disposed on the substrate and disposed in the display area and the non-display area, a first insulating layer disposed on the first conductive layer, a semiconductor layer disposed on the first insulating layer and disposed in the display area, a second insulating layer disposed on the first insulating layer and the semiconductor layer, a second conductive layer disposed on the second insulating layer and overlapping the semiconductor layer, and a third insulating layer disposed on the second conductive layer, wherein the first conductive layer includes two end portions separated by a cutting portion disposed in the non-display area, the two end portions of the first conductive layer may be electrically connected by a first connecting part, and the cutting portion of the first conductive layer may be disposed between the semiconductor layer and the driving voltage transmitting portion.

The first conductive layer may include a light blocking film and a data line, the second conductive layer may include a gate electrode overlapping the semiconductor layer, and a driving voltage transmitting portion overlapping the data line disposed in the non-display area, the driving voltage transmitting portion transmitting a driving voltage, the third conductive layer may include a common voltage transmitting portion overlapping the data line, the common voltage transmitting portion transmitting a common voltage, and the cutting portion of the first conductive layer may be disposed between the semiconductor layer and the common voltage transmitting portion.

The common voltage transmitting portion may overlap the driving voltage transmitting portion.

The first connecting part may be disposed on the third insulating layer, the first insulating layer, the second insulating layer, and the third insulating layer may include a first contact hole and a second contact hole overlapping the two end portions of the first conductive layer, and the first connecting part is electrically connected to the two end portions of the first conductive layer through the first contact hole and the second contact hole.

The first connecting part may be disposed on the second insulating layer, the first insulating layer and the second insulating layer may include a first contact hole and a second contact hole overlapping the two end portions of the first conductive layer, and the first connecting part may be electrically connected to the two end portions of the first conductive layer through the first contact hole and the second contact hole.

The first connecting part may include a lower layer disposed on the second insulating layer and an upper layer disposed on the third insulating layer, the first insulating layer and the second insulating layer may include a first contact hole and a second contact hole overlapping the two end portions of the first conductive layer, the lower layer of the first connecting part may be electrically connected to the two end portions of the first conductive layer through the first contact hole and the second contact hole, the third insulating layer may include a third contact hole and a fourth contact hole overlapping the two end portions of the first conductive layer, and the upper layer of the first connecting part may be electrically connected to the lower layer of the first connecting part through the third contact hole and the fourth contact hole.

The display device according to an embodiment may prevent a short circuit of the signal lines caused by static electricity.

The effect of the embodiments is not limited to the above-described effect, and it is obvious that effects may be variously extended in a range that does not deviate from the spirit and scope of the disclosure.

DETAILED DESCRIPTION OF THE EMBODIMENTS

Figure 1:
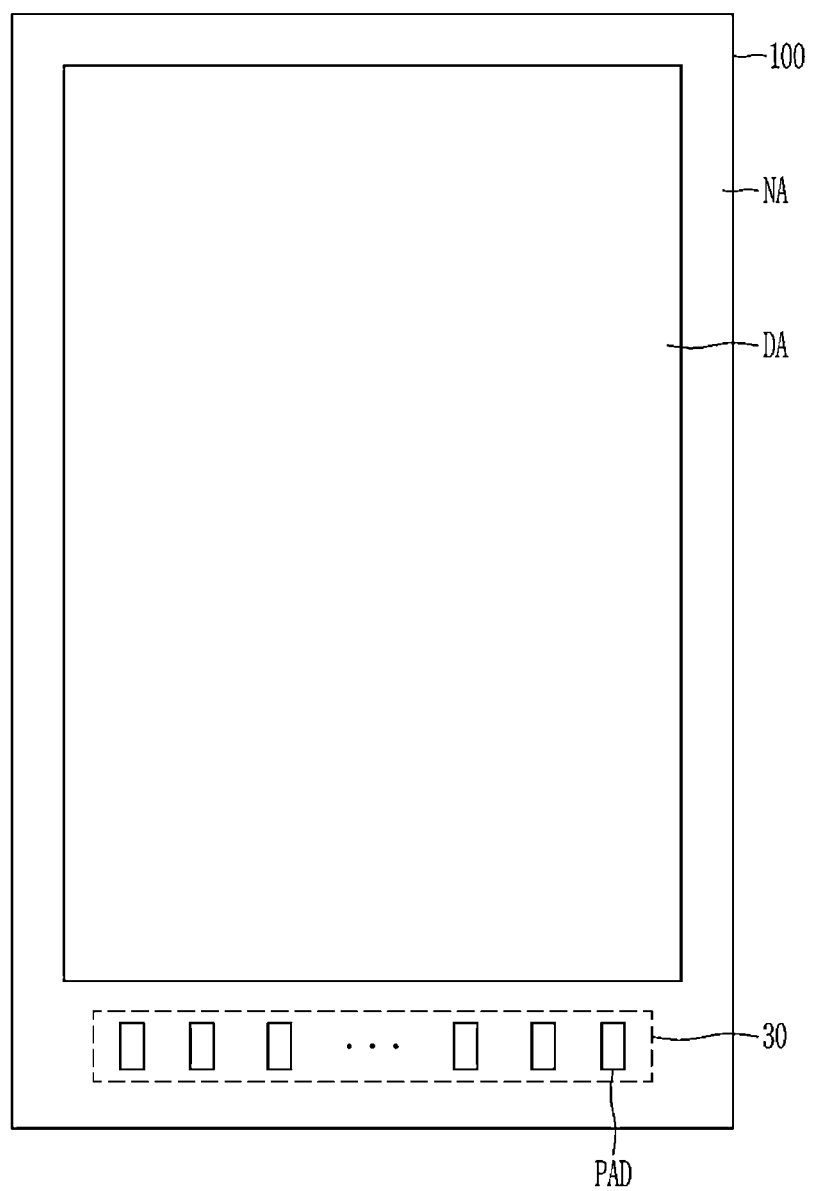
FIG. 1 is a schematic top plan view of a display device according to an embodiment.

The disclosure will be more fully made hereinafter with reference to the accompanying drawings, in which illustrative embodiments are shown. As those skilled in the art would realize, the described embodiments may be modified in various different ways, all without departing from the spirit or scope of the disclosure.

The drawings and description are to be regarded as illustrative in nature and not restrictive, and like reference numerals designate like elements throughout the specification.

In the drawings, size and thickness of each element may be arbitrarily illustrated for convenience of description, and embodiments are not necessarily limited as illustrated in the drawings.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

The term "overlap" may include layer, stack, face or facing, extending over, extending under, covering or partly covering or any other suitable term as would be appreciated and understood by those of ordinary skill in the art.

It will be understood that when an element such as a layer, film, region, or substrate is referred to as being "on" another element, it can be directly on the other element or intervening elements may also be present. In contrast, when an element is referred to as being "directly on" another element, there may be no intervening elements present. Further, in the specification, the word "on" or "above" means positioned on or below the object portion, and does not necessarily mean positioned on the upper side of the object portion based on a gravitational direction.

Unless explicitly described to the contrary, the words "comprise", "have", "include" and the like will be understood to imply the inclusion of stated elements but not the exclusion of any other elements.

Further, the phrase "in a plan view" means viewing a target portion from the top, and the phrase "in a cross-sectional view" means viewing a cross-section formed by vertically cutting a target portion from the side.

When referring to "connected to", this does not only mean that two or more constituent elements are directly connected, but also that two or more constituent elements are electrically connected through other constituent elements as well as being indirectly connected and being physically connected, or they may be referred to by different names according to a position or function, but are integrated.

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A display device according to an embodiment is now described with reference to FIG. 1. FIG. 1 is a schematic top plan view of a display device according to an embodiment.

Referring to FIG. 1, an emissive display device according to an embodiment may include a substrate 100 and a pad portion 30.

The substrate 100 may include a display area DA and a non-display area NA. The display area DA may be a region displaying an image, and the non-display area NA may be a region in which an image may not be displayed, and may be a region surrounding the display area DA.

In the display area DA, a pixel (not shown) including a transistor and a light emitting diode (LED) may be disposed.

In the non-display area NA, a driving voltage line (not shown), a driving low voltage line (not shown), a pad portion 30, and the like for transmitting voltages and signals may be formed in the display area DA.

The pad portion 30 may be disposed on a portion of the non-display area NA and may include pads PAD. Pads PAD may apply a signal to voltage lines (not shown) connected to the display area DA.

In the non-display area NA, a portion of a flexible printed circuit board (FPCB) (not shown) may be disposed. The flexible printed circuit board (FPCB) may be connected to the pad portion 30, and may apply a driving signal to the pad portion 30 from the outside to drive a pixel. A driving integrated circuit (not shown) may be disposed between the flexible printed circuit board (FPCB) and the pad portion 30, thereby the driving signal supplied from the pad portion 30 may be converted in the driving integrated circuit (IC) to be supplied into the display area DA.

Figure 2:
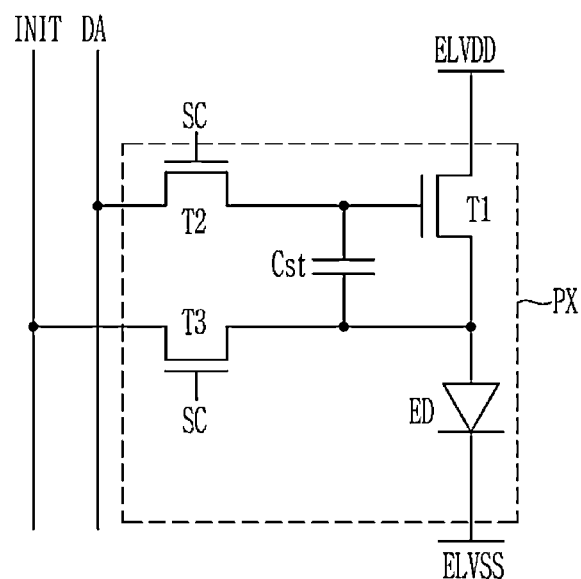
FIG. 2 is a schematic circuit diagram of a pixel of a display device according to an embodiment.
Figure 3:
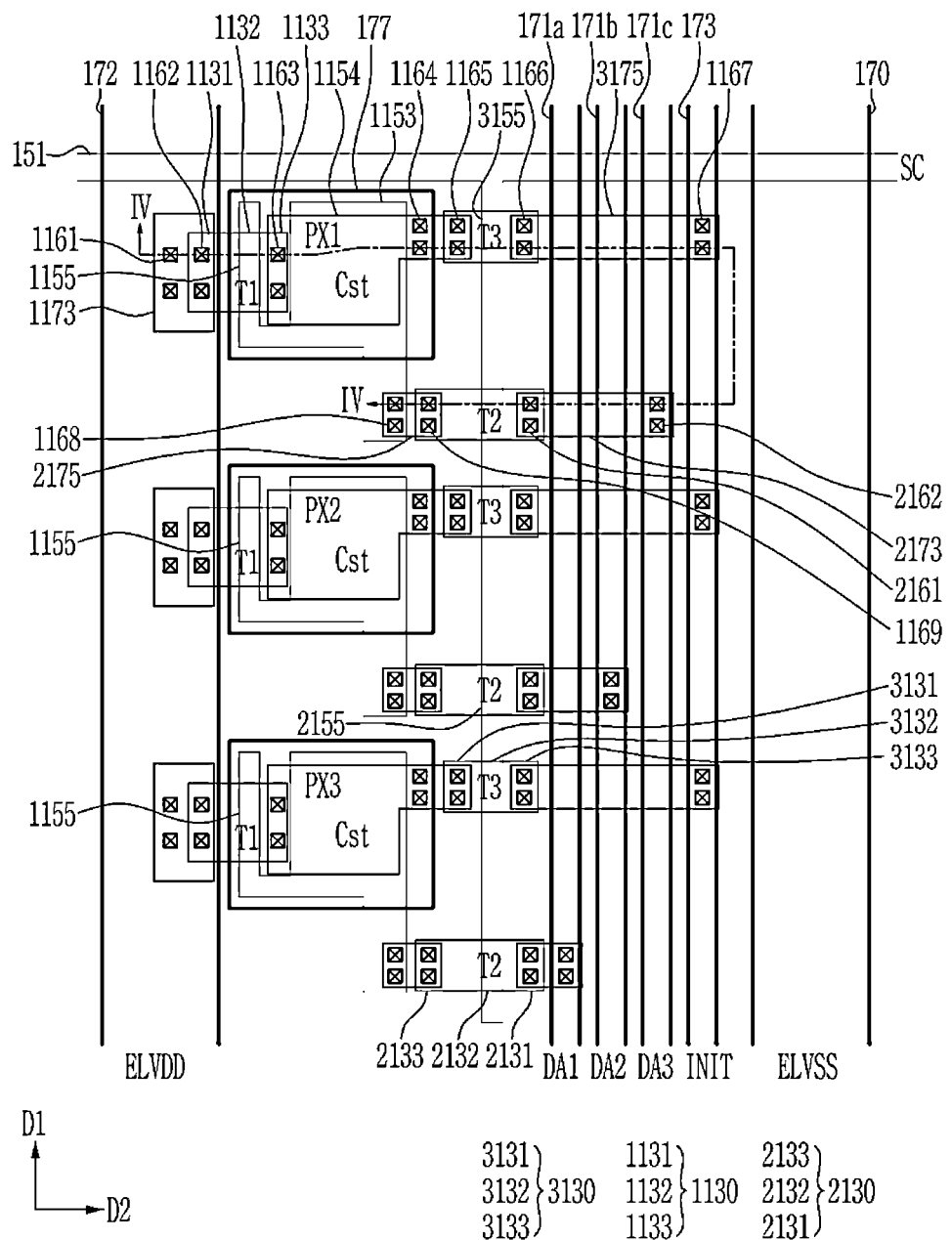
FIG. 3 is a schematic top plan view of a display area of a display device according to an embodiment.
Figure 4:
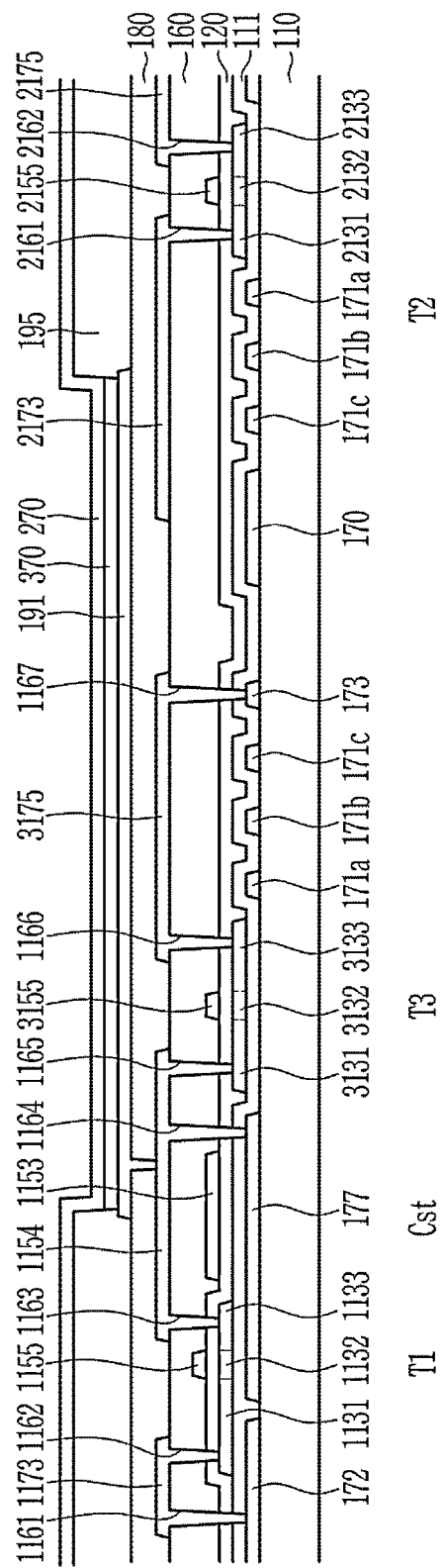
FIG. 4 is a schematic cross-sectional view of a display area taken along line IV-IV of FIG. 3.

The display area of the display device according to an embodiment is described with reference to FIG. 2 to FIG. 8. FIG. 2 is a schematic circuit diagram of a pixel of a display device according to an embodiment, FIG. 3 is a schematic top plan view of a display area of a display device according to an embodiment, and FIG. 4 is a schematic cross-sectional view of a display area taken along line IV-IV of FIG. 3. FIG. 5 to FIG. 8 are schematic top plan views showing certain layers of a display device of FIG. 3.

The display area DA of the display device according to an embodiment may include pixels PX. Referring to FIG. 2, each of the pixels PX may include transistors T1, T2, and T3, a capacitor Cst, and at least one light emitting diode (LED) ED as a light-emitting element. In an embodiment, an example in which one pixel PX includes one light emitting diode (LED) ED is described.

Transistors T1, T2, and T3 may include a driving transistor T1, a switching transistor T2 and an initialization transistor T3. The first electrode and the second electrode to be described below may be electrodes respectively connected to the first region and the second region disposed on opposite sides of the channel of the semiconductor layer of each transistor T1, T2, and T3, and may be a source electrode or a drain electrode. In other embodiments, the first electrode and second electrode may refer to a first region and a second region disposed on opposite sides of the channel of the semiconductor layer.

The gate electrode of the driving transistor T1 may be connected to a terminal of the capacitor Cst, the first electrode of the driving transistor T1 may be connected to the driving voltage line transmitting a driving voltage ELVDD, and the second electrode of the driving transistor T1 may be connected to an anode of the light emitting diode (LED) ED and another terminal of the capacitor Cst. The driving transistor T1 may receive the data voltage DA according to the switching operation of the switching transistor T2 and supply a driving current to the light emitting diode (LED) ED according to the voltage stored in the capacitor Cst.

The gate electrode of the switching transistor T2 may be connected to a first scan line transmitting a first scan signal SC, a first electrode of the switching transistor T2 may be connected to a data line that may transmit a data voltage DA or a reference voltage, and a second electrode of the switching transistor T2 may be connected to a terminal of the capacitor Cst and a gate electrode of the driving transistor T1. The switching transistor T2 may be turned on according to the first scan signal SC, thereby transmitting a reference voltage or the data voltage DA to the gate electrode of the driving transistor T1 and a terminal of the capacitor Cst.

The gate electrode of the initialization transistor T3 may be connected to the first scan line transmitting the first scan signal SC, the first electrode of the initialization transistor T3 may be connected to another terminal of the capacitor Cst, the second electrode of the driving transistor T1, and the anode of the light emitting diode (LED) ED, and the second electrode of the initialization transistor T3 may be connected to the initialization voltage line transmitting the initialization voltage INIT. The initialization transistor T3 may be turned on according to the first scan signal SC, thereby transmitting the initialization voltage INIT to the anode of the light emitting diode (LED) ED and another terminal of the capacitor Cst to initialize the voltage of the anode of the light emitting diode (LED) ED.

A terminal of the capacitor Cst may be connected to the gate electrode of the driving transistor T1, and another terminal may be connected to the first electrode of the initialization transistor T3 and the anode of the light emitting diode (LED) ED. The cathode of the light emitting diode (LED) ED may be connected to the common voltage line transmitting the common voltage ELVSS.

The light emitting diode (LED) ED may emit light of a luminance according to the driving current generated by the driving transistor T1.

In the illustrated embodiment, it has been described that the switching transistor T2 and the initialization transistor T3 may be connected to the same first scan line, but embodiments are not limited thereto, and the switching transistor T2 and the initialization transistor T3 may be connected to different scan lines. For example, the gate electrode of the switching transistor T2 may be connected to the first scan line that transmits the first scan signal SC, and the gate electrode of the initialization transistor T3 may be connected to the second scan line that transmits the second scan signal.

The structure of the display area of the display device according to an embodiment is now described with reference to FIG. 3 to FIG. 8 along with FIG. 2.

FIG. 3 to FIG. 8 show three adjacent pixels among pixels disposed in the display area of the display device according to an embodiment, and three pixels may be disposed repeatedly in the display area of the display device.

Each of multiple pixels PX1, PX2, and PX3 may mean a region or a part where the constituent elements included in a pixel PX as above-described, for example, transistors T1, T2, and T3, the capacitor Cst, and the light emitting diode (LED) ED, may be formed.

Figure 5:
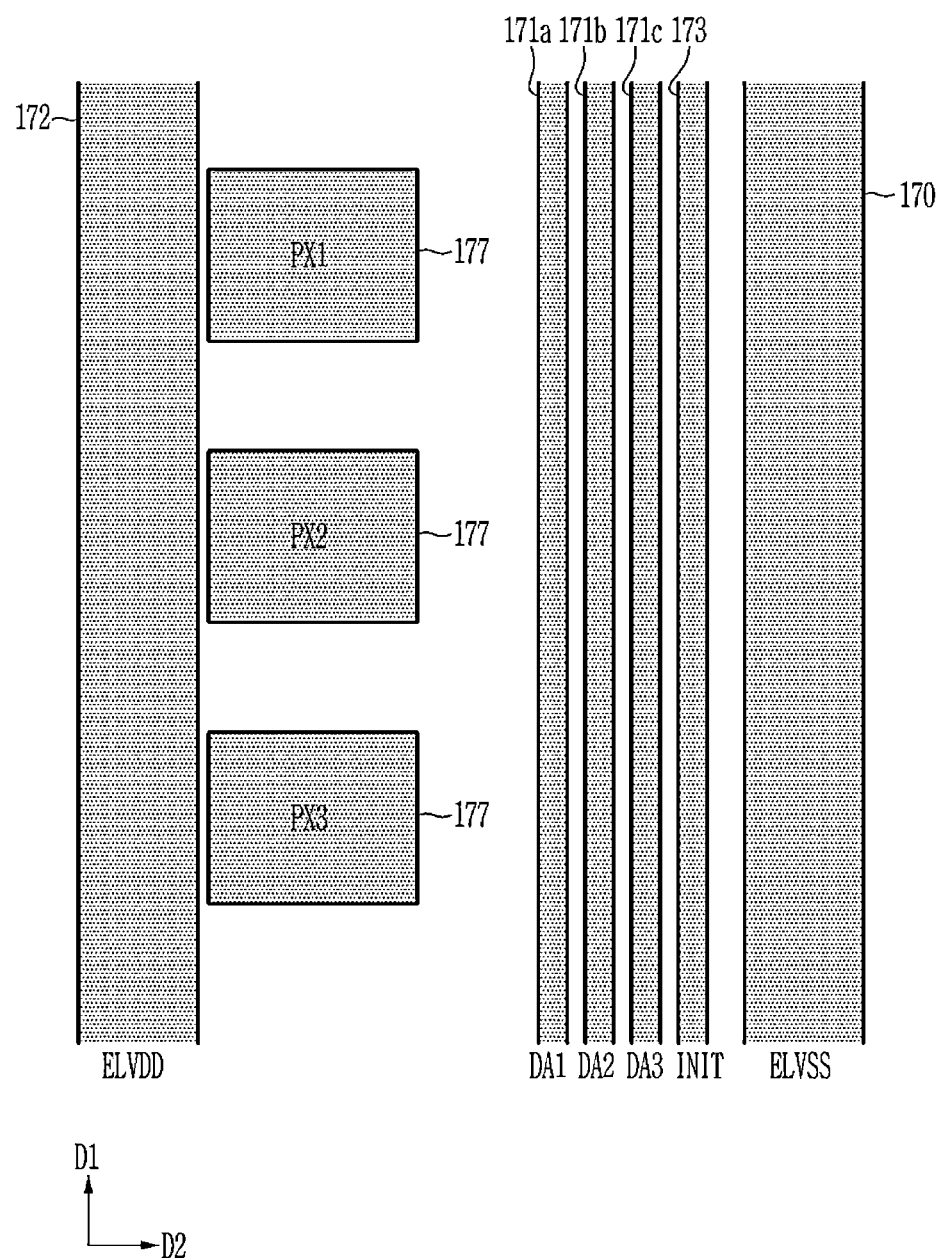
FIG. 5 to FIG. 8 are schematic top plan views showing some layers of a display device of FIG. 3.

Referring to FIG. 5 along with FIG. 3 and FIG. 4, a first conductive layer 171a, 171b, 171c, 170, 172, 173, and 177 including a first data line 171a, a second data line 171b, and a third data line 171c, a common voltage line 170, a driving voltage line 172, an initialization voltage line 173, and a light blocking pattern 177 may be disposed on a substrate 110. FIG. 5 shows the first conductive layer 171a, 171b, 171c, 170, 172, 173, and 177.

The first data line 171a, the second data line 171b, and the third data line 171c may have a width and extend along the first direction D1. The first data line 171a, the second data line 171b, and the third data line 171c may be disposed to be adjacent along the second direction D2 intersecting the first direction D1. The first data line 171a, the second data line 171b, and the third data line 171c may be disposed so as to be spaced apart by an interval. Different data voltages DA1, DA2, and DA3 may be applied to the first data line 171a, the second data line 171b, and the third data line 171c, and they may be disposed apart so that a short between them does not occur.

The first direction D1 may be a column direction and the second direction D2 may be a row direction. The first direction D1 and the second direction D2 may intersect each other and may be orthogonal.

The second data line 171b may be disposed adjacent to the right side of the first data line 171a, and the third data line 171c may be disposed adjacent to the right side of the second data line 171b. At this time, the expression that the data lines 171a, 171b, and 171c may be adjacent to each other means that no other wires extending in a direction parallel to the data lines 171a, 171b, and 171c may be disposed between the data lines 171a, 171b, and 171c. For example, other wires extending in a direction parallel to the data lines 171a, 171b, and 171c may not be disposed between the adjacent first data line 171a and second data line 171b. Also, other wires may not be disposed between the second data line 171b and the third data line 171c adjacent to each other.

The common voltage line 170, the driving voltage line 172, and the initialization voltage line 173 may extend in the first direction D1. For example, the common voltage line 170, the initialization voltage line 173, and the driving voltage line 172 may be extended in a direction parallel to the first to third data lines 171a, 171b, and 171c. The common voltage line 170, the initialization voltage line 173, and the driving voltage line 172 may be disposed so as to be spaced apart by an interval.

The common voltage ELVSS may be applied to the common voltage line 170, the driving voltage ELVDD may be applied to the driving voltage line 172, and the initialization voltage INIT may be applied to the initialization voltage line 173. The common voltage line 170, the initialization voltage line 173, and the driving voltage line 172 to which the different voltages may be applied may be disposed apart from each other so that a short does not occur. The initialization voltage line 173 may be disposed adjacent to the third data line 171c, and the common voltage line 170 may be disposed adjacent to the initialization voltage line 173. However, their positions are not limited thereto and may be changed.

The light blocking pattern 177 may be disposed between the driving voltage line 172 and the first data line 171a on a plane formed by the intersection of the first direction D1 and the second direction D2. Each of the first pixel PX1, the second pixel PX2, and the third pixel PX3 may include a light blocking pattern 177, and light blocking patterns 177 may be disposed to be adjacent along the first direction D1.

Along the direction parallel to the first direction D1, the light blocking pattern 177 of the second pixel PX2 may be disposed under the light blocking pattern 177 of the first pixel PX1, and the light blocking pattern 177 of the third pixel PX3 may be disposed under the light blocking pattern 177 of the second pixel PX2.

The planar shape of the light blocking pattern 177 may be polygonal. The planar shapes of the light blocking patterns 177 of pixels PX1, PX2, and PX3 may be the same as or different from each other. For example, the light blocking pattern 177 of pixels PX1, PX2, and PX3 may be rectangular.

A buffer layer 111 may be disposed on the first conductive layer 171a, 171b, 171c, 170, 172, 173, and 177 including the first data line 171a, the second data line 171b, the third data line 171c, the common voltage line 170, the driving voltage line 172, the initialization voltage line 173, and the light blocking pattern 177.

The buffer layer 111 may be disposed between the substrate 110 and the semiconductor layer to block an impurity from the substrate 110 during a crystallization process to form a polysilicon, thereby improving the characteristics of the polysilicon. By flattening the substrate 110, the stress of the semiconductor layer formed on the buffer layer 111 may be relieved. The buffer layer 111 may include an inorganic insulating material such as a silicon nitride (SiNx), a silicon oxide (SiOx), a silicon oxynitride (SiOxNy), or a combination thereof. The buffer layer may be a single layer or multi-layered structure of the material.

Figure 6:
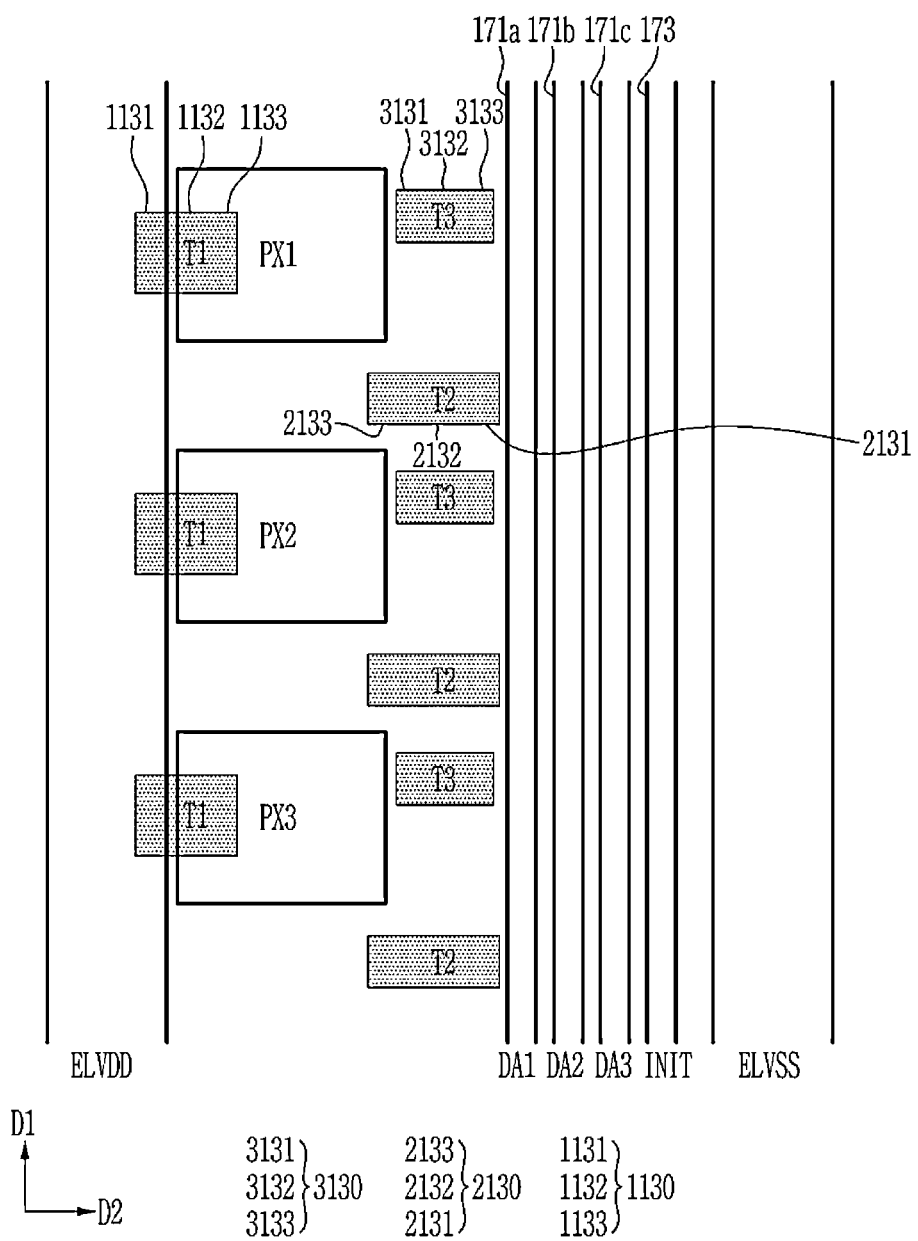

Referring to FIG. 6 along with FIG. 3 and FIG. 4, on the buffer layer 111, a semiconductor layer 1130, 2130, and 3130 may be disposed. The semiconductor layer may include a semiconductor layer 1130 of the driving transistor T1, a semiconductor layer 2130 of the switching transistor T2, and a semiconductor layer 3130 of the initialization transistor T3 of the first pixel PX1, the second pixel PX2, and the third pixel PX3. FIG. 6 shows the first conductive layer 171a, 171b, 171c, 170, 172, 173, and 177 and the semiconductor layer 1130, 2130, and 3130.

The semiconductor layer 1130, 2130, and 3130 may include semiconductor materials such as amorphous silicon, polysilicon, an oxide semiconductor, or a combination thereof.

The semiconductor layer 1130 of the driving transistor T1 may include a first region 1131, a channel 1132, and a second region 1133. The first region 1131 and the second region 1133 may be a source region or a drain region. The first region 1131, the channel 1132, and the second region 1133 may be integral with each other and may have a rod shape extending in the second direction D2. The channel 1132 of the semiconductor layer 1130 of the driving transistor T1 may be disposed between the first region 1131 and the second region 1133. The first region 1131 of the driving transistor T1 may overlap the driving voltage line 172. The first region 1131 of the driving transistor T1 may be connected to the driving voltage line 172 and may receive the driving voltage ELVDD from the driving voltage line 172. However, the first region 1131 of the driving transistor T1 may not be directly connected to the driving voltage line 172 and may be indirectly connected. The channel 1132 and the second region 1133 of the driving transistor T1 may overlap the light blocking pattern 177.

The driving transistors T1 of the first pixel PX1, the second pixel PX2, and the third pixel PX3 may be sequentially disposed along the first direction D1. For example, the driving transistor T1 of second pixel PX2 may be disposed below the driving transistor T1 of the first pixel PX1 along the direction parallel to the first direction D1, and the driving transistor T1 of the third pixel PX3 may be disposed below the driving transistor T1 of the second pixel PX2.

The semiconductor layer 2130 of the switching transistor T2 may include a first region 2131, a channel 2132, and a second region 2133. The first region 2131 and the second region 2133 may be a source region or a drain region. The first region 2131, the channel 2132, and the second region 2133 may be integral with each other and may have a rod shape extending in the second direction D2. The channel 2132 of the semiconductor layer 2130 of the switching transistor T2 may be disposed between the first region 2131 and the second region 2133.

The first region 2131 of the switching transistor T2 may be connected to any one of the data lines 171a, 171b, and 171c. For example, the first region 2131 of the switching transistor T2 of the first pixel PX1 may be connected to the third data line 171c. The first region 2131 of the switching transistor T2 of the second pixel PX2 may be connected to the second data line 171b. The first region 2131 of the switching transistor T2 of the third pixel PX3 may be connected to the first data line 171a. However, the first region 2131 of the switching transistor T2 of the first pixel PX1, the second pixel PX2, and the third pixel PX3 may not be directly connected to each data line 171a, 171b, and 171c, but may be indirectly connected.

The connection relationship between the switching transistor T2 of the first pixel PX1, the second pixel PX2, and the third pixel PX3 and the data lines 171a, 171b, and 171c is not limited thereto, and may be variously changed. For example, the first region 2131 of the switching transistor T2 of the first pixel PX1 may be connected to the first data line 171a, and the first region 2131 of the switching transistor T2 of the third pixel PX3 may be connected to the third data line 171c.

The switching transistors T2 of the first pixel PX1, the second pixel PX2, and the third pixel PX3 may be sequentially positioned along the first direction D1. For example, the switching transistor T2 of the second pixel PX2 may be disposed below the switching transistor T2 of the first pixel PX1 in plan view, and the switching transistor T2 of the third pixel PX3 may be disposed below the switching transistor T2 of the second pixel PX2. The switching transistors T2 of first pixel PX1, the second pixel PX2, and the third pixel PX3 may be connected to the different data lines 171a, 171b, and 171c.

The semiconductor layer 3130 of the initialization transistor T3 may include a first region 3131, a channel 3132, and a second region 3133. The first region 3131 and the second region 3133 may be a source region or a drain region. The first region 3131, the channel 3132, and the second region 3133 may be integral with each other and may have a rod shape extending in the second direction D2. The channel 3132 of the semiconductor layer 3130 of the initialization transistor T3 may be disposed between the first region 3131 and the second region 3133. The second region 3133 of the initialization transistor T3 may be connected to the initialization voltage line 173 and may receive an initialization voltage INIT. However, the second region 3133 of the initialization transistor T3 may not be directly connected to the initialization voltage line 173 and may be indirectly connected. The first region 3131 of the initialization transistor T3 may be connected to the second region 1133 of the driving transistor T1 and the light blocking pattern 177. However, the first region 3131 of the initialization transistor T3 may not be directly connected to the second region 1133 of the driving transistor T1 and the light blocking pattern 177 and may be indirectly connected.

The initialization transistors T3 of the first pixel PX1, the second pixel PX2, and the third pixel PX3 may be sequentially positioned along the first direction D1. For example, in plan view, the initialization transistor T3 of the second pixel PX2 may be disposed below the initialization transistor T3 of the first pixel PX1, and the initialization transistor T3 of the third pixel PX3 may be disposed below the initialization transistor T3 of the second pixel PX2.

A first insulating layer 120 may be disposed on the semiconductor layer 1130, 2130, and 3130 including the semiconductor layer 1130 of the driving transistor T1, the semiconductor layer 2130 of the switching transistor T2, and the semiconductor layer 3130 of the initialization transistor T3.

Figure 7:
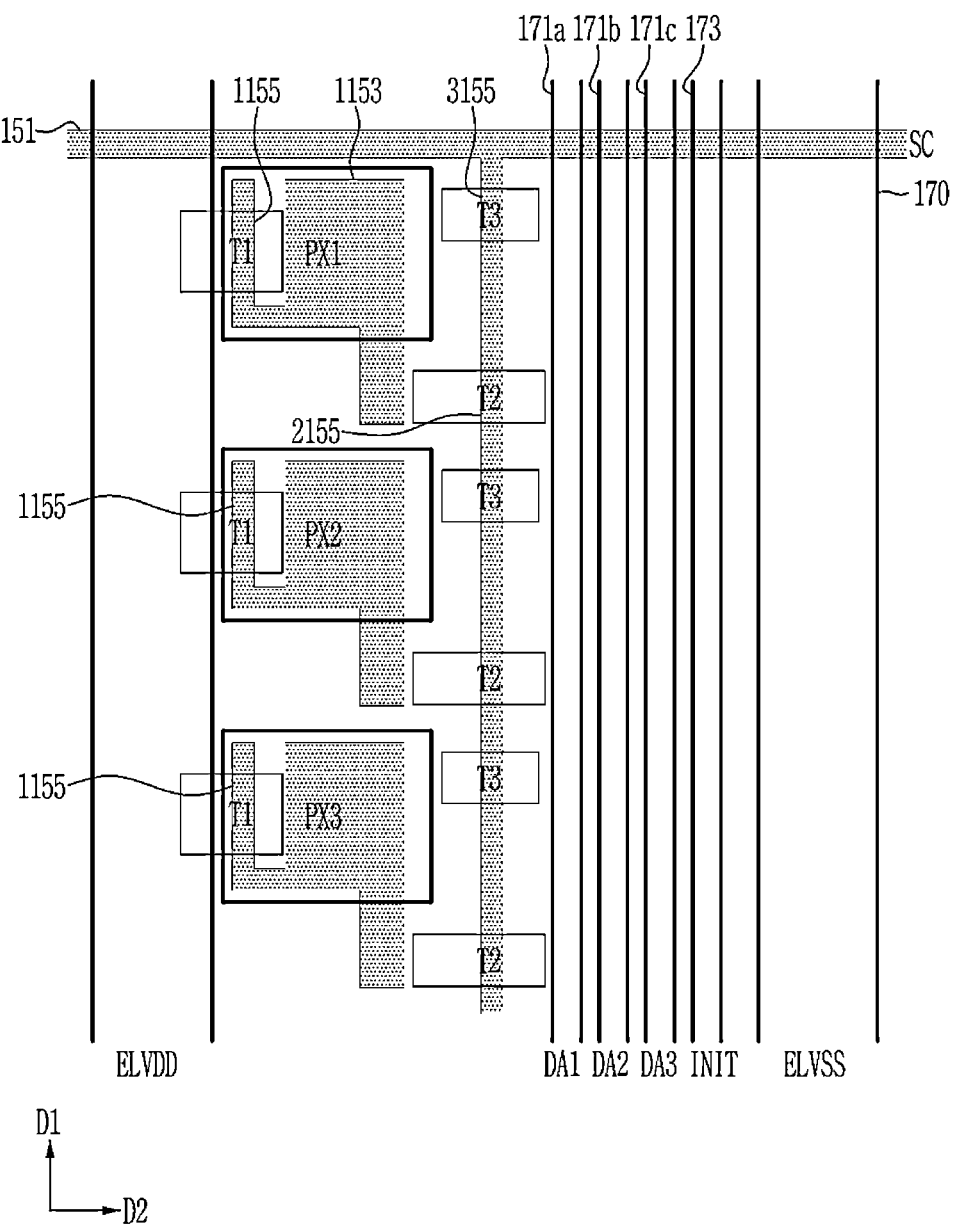

Referring to FIG. 7 along with FIG. 3 and FIG. 4, on the first insulating layer 120, a second conductive layer 1155, 1153, 2155, and 3155 including a gate electrode 1155 of the driving transistor T1, a lower storage electrode 1153, a gate electrode 2155 of the switching transistor T2, and a gate electrode 3155 of the initialization transistor T3 of the first pixel PX1, the second pixel PX2, and the third pixel PX3 may be disposed. FIG. 7 shows the first conductive layer, the semiconductor layer, and the second conductive layer.

The gate electrode 1155 of the driving transistor T1 may overlap the channel 1132 of the driving transistor T1. The gate electrode 1155 of the driving transistor T1 may extend from the lower storage electrode 1153 and these elements may be integral with each other. The lower storage electrode 1153 may be connected to the second region 2133 of the switching transistor T2. However, the lower storage electrode 1153 may not be directly connected to the second region 2133 of the switching transistor T2 and may be indirectly connected.

The planar shape of the lower storage electrode 1153 may be polygonal. The planar shape of the lower storage electrode 1153 of the first pixel PX1, the second pixel PX2, and the third pixel PX3 may be the same as or different from each other.

The gate electrode 2155 of switching transistor T2 may overlap the channel 2132 of the switching transistor T2. The gate electrodes 2155 of the switching transistor T2 of the first pixel PX1, the second pixel PX2, and the third pixel PX3 may be connected to each other and may be integrated. Accordingly, the same first scan signal SC may be applied to the gate electrode 2155 of the switching transistor T2 of the first pixel PX1, the second pixel PX2, and the third pixel PX3. At this time, the gate electrode 2155 of the switching transistor T2, which may be connected to each other, may have a rod shape extending in the first direction D1.

The gate electrode 3155 of the initialization transistor T3 may overlap the channel 3132 of the initialization transistor T3. The gate electrodes 3155 of the initialization transistors T3 of the first pixel PX1, the second pixel PX2, and the third pixel PX3 may be connected to each other or may be integral with each other. Accordingly, the same first scan signal SC may be applied to the gate electrodes 3155 of the initialization transistors T3 of the first pixel PX1, the second pixel PX2, and the third pixel PX3. The gate electrode 3155 of the initialization transistor T3, which may be connected to each other, may have a rod shape extending in the first direction D1.

The second conductive layer may further include a first scan line 151. The first scan line 151 may extend along the second direction D2, for example, in the row direction. The first scan line 151 may be connected to the gate electrode 3155 of the initialization transistor T3 and the gate electrode 2155 of the switching transistor T2 of the first pixel PX1, the second pixel PX2, and the third pixel PX3 and may be integral with each other.

In the shown embodiment, it is described that the gate electrode 2155 of the switching transistor T2 and the gate electrode 3155 of the initialization transistor T3 may be connected to the same first scan line 151, however embodiments are not limited thereto, and the switching transistor T2 and the initialization transistor T3 may be connected to different scan lines. For example, the gate electrode 2155 of the switching transistor T2 may be connected to the first scan line transmitting the first scan signal SC, and the gate electrode 3155 of the initialization transistor T3 may be connected to the second scan line transmitting the second scan signal.

After forming the second conductive layer, a doping process or a plasma treatment may be performed. The semiconductor layer covered by the second conductive layer may not be doped or plasma-treated, and the portion of the semiconductor layer that may not be covered by the second conductive layer may be doped or plasma-treated, so that it may have the same characteristics as the conductor. For example, the channel 1132 of the driving transistor T1, the channel 2132 of the switching transistor T2, and the channel 3132 of the initialization transistor T3, which may be covered by the second conductive layer, may not be subjected to the doping or the plasma treatment. The first region 1131 and the second region 1133 of the driving transistor T1, the first region 2131 and the second region 2133 of the switching transistor T2, and the first region 3131 and the second region 3133 of the initialization transistor T3, which may not be covered by the second conductive layer, may be doped or plasma-treated, thereby having the same characteristic as the conductor.

A second insulating layer 160 may be disposed on the gate electrode 1155 of the driving transistor T1, the lower storage electrode 1153, the gate electrode 2155 of the switching transistor T2, and the gate electrode 3155 of the initialization transistor T3.

Figure 8:
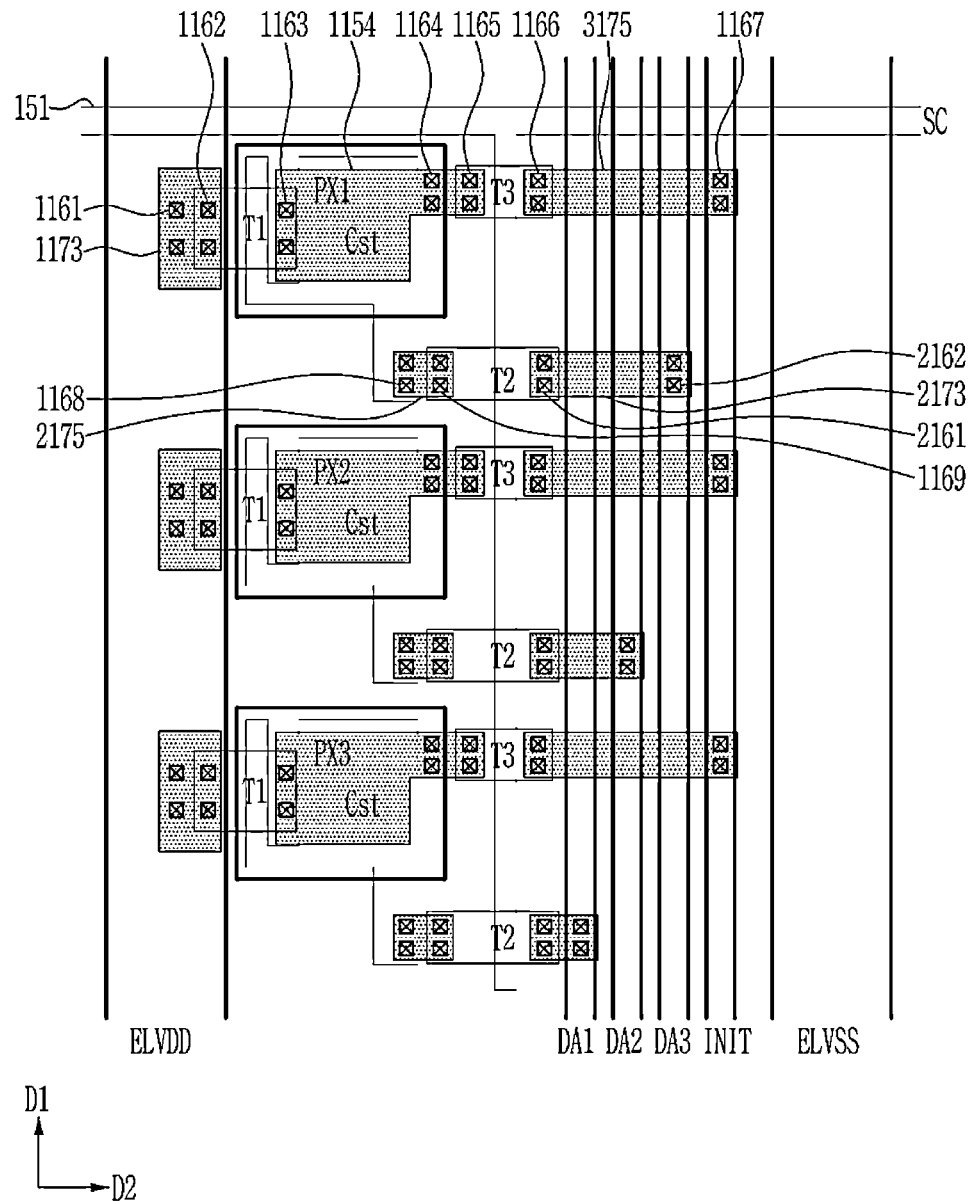

Referring to FIG. 8 along with FIG. 3 and FIG. 4, on the second insulating layer 160, a third conductive layer 1173, 1154, 2173, 2175, and 3175 including a first electrode 1173 of the driving transistor T1, an upper storage electrode 1154, a first electrode 2173 and a second electrode 2175 of the switching transistor T2, and a second electrode 3175 of the initialization transistor T3 may be disposed. FIG. 8 shows the first conductive layer 171a, 171b, 171c, 170, 172, 173, and 177, the semiconductor layer 1130, 2130, and 3130, the second conductive layer 1155, 1153, 2155, and 3155, and the third conductive layer 1173, 1154, 2173, 2175, and 3175.

The first electrode 1173 of the driving transistor T1 may overlap the driving voltage line 172. The second insulating layer 160 may include an opening 1161 overlapping the first electrode 1173 of the driving transistor T1 and the driving voltage line 172. The opening 1161 may be further formed in the first insulating layer 120 and the buffer layer 111. The first electrode 1173 of the driving transistor T1 may be connected to the driving voltage line 172 through the opening 1161. The first electrode 1173 of the driving transistor T1 may overlap the first region 1131 of the semiconductor layer 1130 of the driving transistor T1. The second insulating layer 160 may include an opening 1162 overlapping the first electrode 1173 of the driving transistor T1 and the first region 1131 of the semiconductor layer 1130 of the driving transistor T1. The opening 1162 may be further formed in the first insulating layer 120. The first electrode 1173 of the driving transistor T1 may be connected to the first region 1131 of the semiconductor layer 1130 of the driving transistor T1 through the opening 1162. The first region 1131 of the semiconductor layer 1130 of the driving transistor T1 may be connected to the driving voltage line 172 through the first electrode 1173 of the driving transistor T1. Accordingly, the driving voltage ELVDD may be applied to the first region 1131 of the semiconductor layer 1130 of the driving transistor T1 through the driving voltage line 172.

The upper storage electrode 1154 may overlap the lower storage electrode 1153. The lower storage electrode 1153 and the upper storage electrode 1154 may overlap each other with the second insulating layer 160 therebetween to form the capacitor Cst. The lower storage electrode 1153 may also overlap the light blocking pattern 177 via the first insulating layer 120 therebetween, so that the capacitor Cst may be formed double.

The upper storage electrode 1154 may overlap the second region 1133 of the driving transistor T1. The second insulating layer 160 may include an opening 1163 overlapping the upper storage electrode 1154 and the second region 1133 of the driving transistor T1. The opening 1163 may be further formed in the first insulating layer 120. The upper storage electrode 1154 may be connected to the second region 1133 of the driving transistor T1 through the opening 1163.

The upper storage electrode 1154 may overlap the light blocking pattern 177. The second insulating layer 160 may include an opening 1164 overlapping the upper storage electrode 1154 and the light blocking pattern 177. The opening 1164 may be further formed in the first insulating layer 120 and the buffer layer 111. The upper storage electrode 1154 may be connected to the light blocking pattern 177 through the opening 1164.

The upper storage electrode 1154 may overlap the first region 3131 of the initialization transistor T3. The second insulating layer 160 may include an opening 1165 overlapping the upper storage electrode 1154 and the first region 3131 of the initialization transistor T3. The opening 1165 may be further formed in the first insulating layer 120. The upper storage electrode 1154 may be connected to the first region 3131 of the initialization transistor T3 through the opening 1165.

Each of the first pixel PX1, the second pixel PX2, and the third pixel PX3 may include the upper storage electrode 1154, the lower storage electrode 1153, and the light blocking pattern 177. The upper storage electrode 1154, the lower storage electrode 1153, and the light blocking pattern 177 of the first pixel PX1, the second pixel PX2, and the third pixel PX3 may be disposed between the driving voltage line 172 and the first data line 171a in plan view. The upper storage electrodes 1154 of the first pixel PX1, the second pixel PX2, and the third pixel PX3 may be disposed to be adjacent along the first direction D1. In plan view, the upper storage electrode 1154 of the second pixel PX2 may be disposed below the upper storage electrode 1154 of the first pixel PX1, and the upper storage electrode 1154 of the third pixel PX3 may be disposed below the upper storage electrode 1154 of the second pixel PX2. The lower storage electrodes 1153 of the first pixel PX1, the second pixel PX2, and the third pixel PX3 may be disposed to be adjacent along the first direction D1. In plan view, the lower storage electrode 1153 of the second pixel PX2 may be disposed below the lower storage electrode 1153 of the first pixel PX1, and the lower storage electrode 1153 of the third pixel PX3 may be disposed below the lower storage electrode 1153 of the second pixel PX2.

The planar shape of the upper storage electrode 1154 may be polygonal. The planar shape of the upper storage electrode 1154 of the first pixel PX1, the second pixel PX2, and the third pixel PX3 may be the same as or different from each other.

An end portion of the first electrode 2173 of the switching transistor T2 may overlap the first region 2131 of the semiconductor layer 2130 of the switching transistor T2. The second insulating layer 160 may include an opening 2161 overlapping the first electrode 2173 of the switching transistor T2 and the first region 2131 of the semiconductor layer 2130. The opening 2161 may be further formed in the first insulating layer 120. The first electrode 2173 of the switching transistor T2 may be connected to the first region 2131 of the semiconductor layer 2130 of the switching transistor T2 through the opening 2161.

Another end portion of the first electrode 2173 of the switching transistor T2 may overlap the data lines 171a, 171b, and 171c. The second insulating layer 160 may include an opening 2162 overlapping the first electrode 2173 of the switching transistor T2 and the data line 171a, 171b, and 171c. The opening 2162 may be further formed in the first insulating layer 120. The first electrode 2173 of the switching transistor T2 may be connected to any one of the data lines 171a, 171b, and 171c through the opening 2162. In the first pixel PX1, the first electrode 2173 of the switching transistor T2 may be connected to the third data line 171c through the opening 2162. In the second pixel PX2, the first electrode 2173 of the switching transistor T2 may be connected to the second data line 171b, and in the third pixel PX3, the first electrode 2173 of the switching transistor T2 may be connected to the first data line 171a. However, embodiments are not limited thereto, and the connection relationship between the first electrode 2173 of the switching transistor T2 and the data lines 171a, 171b, and 171c in the first pixel PX1, the second pixel PX2, and the third pixel PX3 may be variously changed. For example, in the first pixel PX1, the first electrode 2173 of the switching transistor T2 may be connected to the first data line 171a.

An end portion of the second electrode 2175 of the switching transistor T2 may overlap the second region 2133 of the semiconductor layer 2130 of the switching transistor T2. The second insulating layer 160 may include an opening 1169 overlapping the second electrode 2175 of the switching transistor T2 and the second region 2133 of the semiconductor layer 2130. The opening 1169 may be further formed in the first insulating layer 120. The second electrode 2175 of the switching transistor T2 may be connected to the second region 2133 of the semiconductor layer 2130 of the switching transistor T2 through the opening 1169.

Another end portion of the second electrode 2175 of the switching transistor T2 may overlap the lower storage electrode 1153. The second insulating layer 160 may include an opening 1168 overlapping the second electrode 2175 of the switching transistor T2 and the lower storage electrode 1153. The second electrode 2175 of the switching transistor T2 may be connected to the lower storage electrode 1153 through the opening 1168. Accordingly, the second region 2133 of the semiconductor layer 2130 of the switching transistor T2 may be connected to the gate electrode 1155 of the driving transistor T1 through the second electrode 2175 and the lower storage electrode 1153.

An end portion of the second electrode 3175 of the initialization transistor T3 may overlap the second region 3133 of the semiconductor layer 3130 of the initialization transistor T3. The second insulating layer 160 may include an opening 1166 overlapping the second electrode 3175 of the initialization transistor T3 and the second region 3133 of the semiconductor layer 3130. The opening 1166 may be further formed in the first insulating layer 120. The second electrode 3175 of the initialization transistor T3 may be connected to the second region 3133 of the semiconductor layer 3130 of the initialization transistor T3 through the opening 1166.

Another end portion of the second electrode 3175 of the initialization transistor T3 may overlap the initialization voltage line 173. The second insulating layer 160 may include an opening 1167 overlapping the second electrode 3175 of the initialization transistor T3 and the initialization voltage line 173. The opening 1167 may be further formed in the first insulating layer 120 and the buffer layer 111. The second electrode 3175 of the initialization transistor T3 may be connected to the initialization voltage line 173 through the opening 1167. Accordingly, the second region 3133 of the semiconductor layer 3130 of the initialization transistor T3 may be connected to the initialization voltage line 173 through the second electrode 3175. The second region 3133 of the semiconductor layer 3130 of the initialization transistor T3 may receive the initialization voltage INIT through the initialization voltage line 173.

A third insulating layer 180 may be disposed on the third conductive layer including the first electrode 1173 of the driving transistor T1, the upper storage electrode 1154, the first electrode 2173, and the second electrode 2175 of the switching transistor T2, and the second electrode 3175 of the initialization transistor T3.

At least one of the first conductive layer, the second conductive layer, and the third conductive layer may include at least one among metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (T1), chromium (Cr), tantalum (Ta), and alloys thereof. Each of the first conductive layer, the second conductive layer, and the third conductive layer may be composed of a single layer or multiple layers. For example, at least one of the first conductive layer, the second conductive layer, and the third conductive layer may have a multi-layered structure including a lower layer including titanium and an upper layer including copper.

At least one of the buffer layer 111, the first insulating layer 120, the second insulating layer 160, and the third insulating layer 180 may include inorganic insulating materials such as a silicon nitride (SiNx), a silicon oxide (SiOx), a silicon oxynitride (SiON), etc., and/or organic insulating materials such as a polyimide, an acryl-based polymer, and a siloxane-based polymer.

A pixel electrode 191 may be disposed on the third insulating layer 180. The pixel electrode 191 may be connected to the driving transistor T1 and may receive the output current of the driving transistor T1.

A fourth insulating layer 195 may be disposed on the pixel electrode 191. An opening may be formed in the fourth insulating layer 195, and the opening of the fourth insulating layer 195 may overlap the pixel electrode 191.

An emission layer 370 may be disposed on the pixel electrode 191 and the fourth insulating layer 195, and a common electrode 270 may be disposed on the emission layer 370. The pixel electrode 191, the emission layer 370, and common electrode 270 may constitute the light emitting diode (LED) ED.

Figure 9:
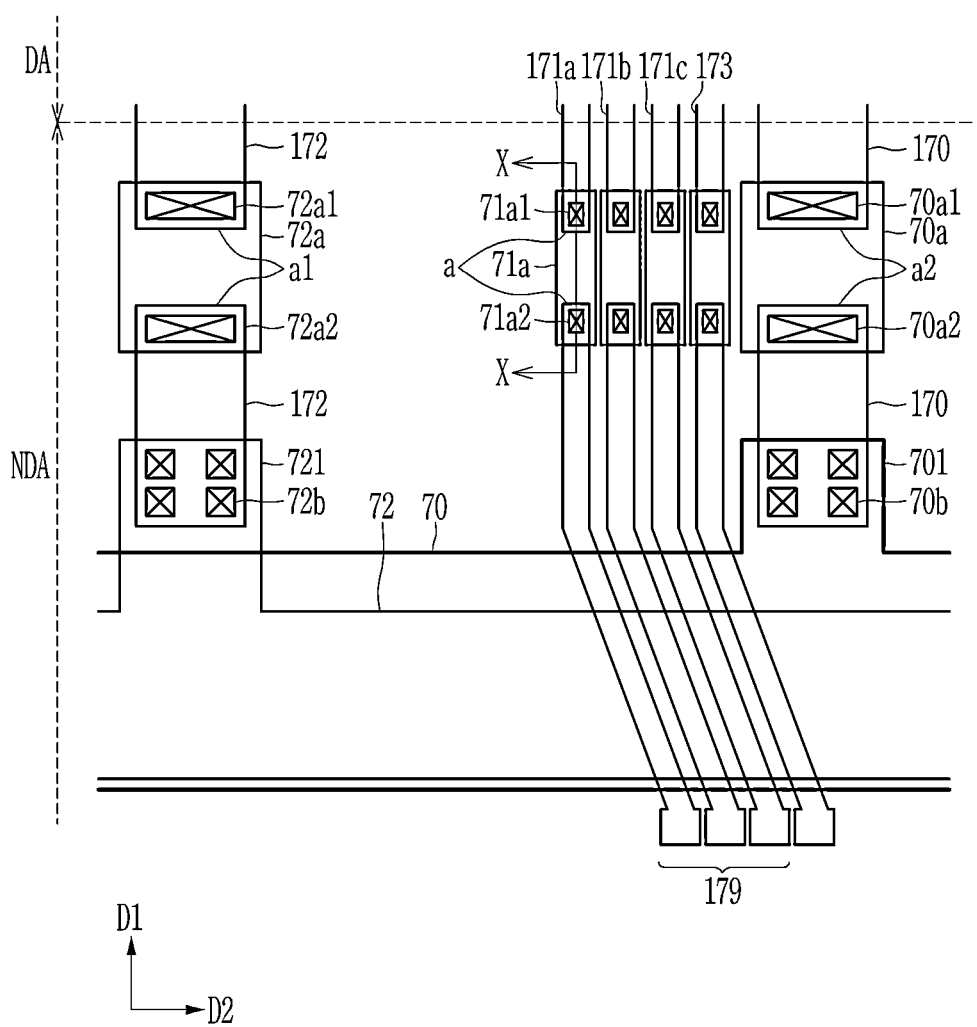
FIG. 9 is a schematic top plan view showing a portion of a non-display area of a display device according to an embodiment.

The non-display area of the display device according to an embodiment is described with reference to FIG. 9 and FIG. 10. FIG. 9 is a schematic top plan view showing a portion of a non-display area of a display device according to an embodiment, and FIG. 10 is a schematic cross-sectional view of a non-display area of a display device taken along line X-X of FIG. 9 according to an embodiment.

Figure 10:
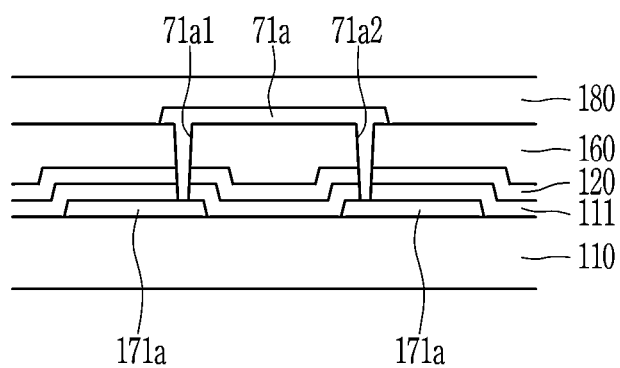
FIG. 10 is a schematic cross-sectional view of a non-display area of a display device taken along line X-X of FIG. 9 according to an embodiment.

Referring to FIG. 9 and FIG. 10 along with FIG. 1, the first data line 171a, the second data line 171b, the third data line 171c, the common voltage line 170, the driving voltage line 172, and the initialization voltage line 173 disposed on the substrate 110 may extend to the non-display area NDA in the direction parallel to the first direction D1.

The first data line 171a, the second data line 171b, and the third data line 171c may include a pad portion 179 formed on the end portion, and the pad portion 179 of the first data line 171a, the second data line 171b, and the third data line 171c may be connected to a driver such as the flexible printed circuit board (FPCB) to receive the data signal.

In the non-display area NDA, a driving voltage transmitting portion 72 and a common voltage transmitting portion 70 extending along the second direction D2 may be disposed at the position overlapping the first data line 171a, the second data line 171b, the third data line 171c, the common voltage line 170, the driving voltage line 172, and the initialization voltage line 173.

The driving voltage transmitting portion 72 may include a first extending portion 721 extending toward the driving voltage line 172. The first insulating layer 120 and the buffer layer 111 disposed on the driving voltage line 172 may have first contact holes 72b overlapping the end portion of the driving voltage line 172, and the first extending portion 721 of the driving voltage transmitting portion 72 may be connected to the driving voltage line 172 through first contact holes 72b, thereby applying the driving voltage ELVDD to the driving voltage line 172.

The driving voltage transmitting portion 72 may be formed together with the same layer as the second conductive layer 1155, 1153, 2155, and 3155 of the display area DA, thereby being made of the same layer as the second conductive layer 1155, 1153, 2155, and 3155 of the display area DA.

The common voltage transmitting portion 70 may include a second extending portion 701 extending toward the common voltage line 170. The second insulating layer 160, the first insulating layer 120, and the buffer layer 111 disposed on the common voltage line 170 may have second contact holes 70b overlapping the end portion of the common voltage line 170, and the second extending portion 701 of the common voltage transmitting portion 70 may be connected to the common voltage line 170 through second contact holes 70b, thereby applying the common voltage ELVSS to the common voltage line 170.

The common voltage transmitting portion 70 may be formed with the same layer as the third conductive layer 1173, 1154, 2173, 2175, and 3175 of the display area DA, thereby being made of the same layer as the second conductive layer 1155, 1153, 2155, and 3155 of the display area DA.

On a plane formed by the intersection of the first direction D1 and the second direction D2, the first data line 171a, the second data line 171b, the third data line 171c, the common voltage line 170, the driving voltage line 172, and the initialization voltage line 173 may include cutting portions a, a1, and a2 disposed in the region disposed between the display area DA, and the driving voltage transmitting portion 72 and the common voltage transmitting portion 70.

Two end portions adjacent to each other of each of the first data line 171a, the second data line 171b, and the third data line 171c separated from each other along the first direction D1 by the cutting portion a of the first data line 171a, the second data line 171b, and the third data line 171c may be connected to each other by the first connecting member (e.g., part) 71a. Similarly, the data lines 171a, 171b, and 171c, and two end portions forming the cutting portion a of the initialization voltage line 173, may be connected to each other by the first connecting member 71a.

Referring to FIG. 10, the second insulating layer 160, the first insulating layer 120, and the buffer layer 111 disposed on the first data line 171a, the second data line 171b, and the third data line 171c may have a third contact hole 71a1 and a fourth contact hole 71a2, and the third contact hole 71a1 and the fourth contact hole 71a2 may overlap two end portions adjacent to each other while forming the cutting portion a. The first connecting member 71a may be disposed on the third contact hole 71a1 and the fourth contact hole 71a2, and two end portions forming the cutting portion a of the first data line 171a, the second data line 171b, and the third data line 171c may be connected to each other through the third contact hole 71a1 and the fourth contact hole 71a2.

The first connecting member 71a may be formed together of the same layer as the third conductive layer 1173, 1154, 2173, 2175, and 3175 of the display area DA, thereby being made of the same layer as the third conductive layer 1173, 1154, 2173, 2175, and 3175 of the display area DA.

Similarly, two end portions adjacent to each other of the driving voltage line 172 separated along first direction D1 by the cutting portion a1 of the driving voltage line 172 may be connected to each other by the second connecting member 72a, and two end portions adjacent to each other of the common voltage line 170 spaced along the first direction D1 by the cutting portion of the common voltage line 170 a2 may be connected to each other by the third connecting member 70a.

In the second insulating layer 160, the first insulating layer 120, and the buffer layer 111, a fifth contact hole 72a1 and a sixth contact hole 72a2 overlapping two end portions forming the cutting portion a1 of the driving voltage line 172 may be formed, and the second connecting member 72a may be disposed on the fifth contact hole 72a1 and the sixth contact hole 72a2 and connects two end portions that form the cutting portion a1 of the driving voltage line 172 through the fifth contact hole 72a1 and the sixth contact hole 72a2. Similarly, the second insulating layer 160, the first insulating layer 120, and the buffer layer 111 may have a seventh contact hole 70a1 and an eighth contact hole 70a2 overlapping two end portions forming the cutting portion a2 of the common voltage line 170, and the third connecting member 70a may be disposed on the seventh contact hole 70a1 and the eighth contact hole 70a2 and connects two end portions of the cutting portion a2 of the common voltage line 170 to each other through the seventh contact hole 70a1 and the eighth contact hole 70a2.

Like the first connecting member 71a, the second connecting member 72a and the third connecting member 70a may be formed together in the same layer as the third conductive layer 1173, 1154, 2173, 2175, and 3175 of the display area DA, thereby being made of the same layer as the third conductive layer 1173, 1154, 2173, 2175, and 3175 of the display area DA.

Among the first conductive layer 171a, 171b, 171c, 170, 172, 173, and 177 disposed on (e.g., directly on) the substrate 110, the first data line 171a, the second data line 171b, the third data line 171c, the common voltage line 170, the driving voltage line 172, and the initialization voltage line 173 may extend long over the display area DA and the non-display area NDA along the first direction D1. Static electricity that may occur during the manufacturing process may move through the first data line 171a, the second data line 171b, the third data line 171c, the common voltage line 170, the driving voltage line 172, and the initialization voltage line 173.

As described above, the driving voltage transmitting portion 72 and the common voltage transmitting portion 70 extending along the second direction D2 may be disposed in the non-display area NDA, and the driving voltage transmitting portion 72 and the common voltage transmitting portion 70 may overlap the first data line 171a, the second data line 171b, and the third data line 171c.

As such, the overlapping portion of the first data line 171a, the second data line 171b, and the third data line 171c composed of the first conductive layer, the driving voltage transmitting portion 72 composed of the second conductive layer, and the common voltage transmitting portion 70 composed of the third conductive layer may be shorted by the static electricity. Particularly, the static electricity flowing through the first data line 171a, the second data line 171b, and the third data line 171c extending long along the display area DA and the non-display area NDA in the first direction D1 may be gathered at the end portions of the first data line 171a, the second data line 171b, and the third data line 171c, and as a result, the insulating layers 111, 120, and 160 may be destroyed by the static electricity collected at the overlapping portions of the data lines 171a, 171b, and 171c and the driving voltage transmitting portion 72 and the common voltage transmitting portion 70.

However, according to the display device according to an embodiment, on a plane where the first direction D1 and the second direction D2 intersect, the first data line 171a, the second data line 171b, the third data line 171c, the common voltage line 170, the driving voltage line 172, and the initialization voltage line 173 may include the cutting portions a, a1, and a2 disposed on the region disposed between the display area DA, and the driving voltage transmitting portion 72 and the common voltage transmitting portion 70, two end portions forming the cutting portions a, a1, and a2 of the first data line 171a, the second data line 171b, the third data line 171c, the common voltage line 170, the driving voltage line 172, and the initialization voltage line 173, may be connected through the first connecting member 71a, the second connecting member 72a, and the third connecting member 70a. Accordingly, the static electricity flowing to the non-display area NDA through the display area DA during the manufacturing process may be dispersed or discharged through the first connecting member 71a, the second connecting member 72a, and the third connecting member 70a, whereby the static electricity may not move to the portion overlapping the driving voltage transmitting portion 72 and the common voltage transmitting portion 70.

Accordingly, the static electricity may be prevented from moving to the overlapping portion of the data lines 171a, 171b, and 171c made of the first conductive layer, the driving voltage transmitting portion 72 made of the second conductive layer, and the common voltage transmitting portion 70 made of the third conductive layer, and the short circuit due to the static electricity may be prevented.

Figure 11:
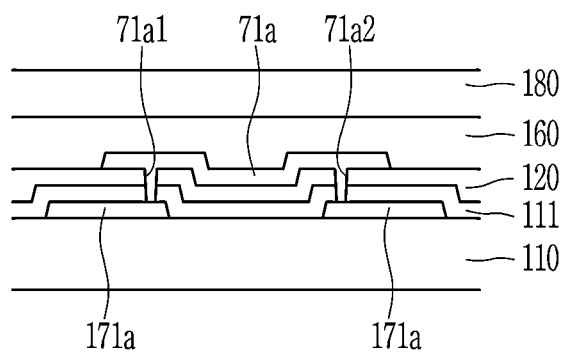
FIG. 11 is a schematic cross-sectional view of a non-display area of a display device taken along line X-X of FIG. 9 according to another embodiment.

The non-display area of the display device according to another embodiment is described with reference to FIG. 11 along with FIG. 9. FIG. 11 is a schematic cross-sectional view of a non-display area of a display device taken along line X-X of FIG. 9 according to another embodiment.

Referring to FIG. 11, the non-display area of the display device according to an embodiment may be similar to the non-display area of the display device according to an embodiment described with reference to FIG. 9 and FIG. 10 above. A detailed description of the same constituent elements is omitted.

Referring to FIG. 11 along with FIG. 9, in the non-display area NDA, the driving voltage transmitting portion 72 and the common voltage transmitting portion 70 extending along the second direction D2 may be disposed at the position overlapping the first data line 171a, the second data line 171b, the third data line 171c, the common voltage line 170, the driving voltage line 172, and the initialization voltage line 173.

On a plane formed by the intersection of the first direction D1 and the second direction D2, the first data line 171a, the second data line 171b, the third data line 171c, the common voltage line 170, the driving voltage line 172, and the initialization voltage line 173 may include the cutting portions a, a1, and a2 disposed at the region disposed between the display area DA, and the driving voltage transmitting portion 72 and the common voltage transmitting portion 70.

Two end portions adjacent to each other of each of the first data line 171a, the second data line 171b, and the third data line 171c separated along the first direction D1 by the cutting portion a of the first data line 171a, the second data line 171b, and the third data line 171c may be connected to each other by the first connecting member 71a.

Similarly, two end portions adjacent to each other of the driving voltage line 172 separated along the first direction D1 by the cutting portion a1 of the driving voltage line 172 may be connected to each other by the second connecting member 72a, and two end portions adjacent to each other of the common voltage line 170 spaced along the first direction D1 by the cutting portion a2 of the common voltage line 170 may be connected to each other by the third connecting member 70a.

However, unlike the display device according to an embodiment described with reference to FIG. 10, the first connecting member 71a of the display device according to an embodiment may be formed together with the same layer as the second conductive layer 1155, 1153, 2155, and 3155 of the display area DA, thereby being made of the same layer as the second conductive layer 1155, 1153, 2155, and 3155 of the display area DA. The first connecting member 71a may be disposed above the third contact hole 71a1 and the fourth contact hole 71a2 formed in the first insulating layer 120 and the buffer layer 111, and the first connecting member 71a may connect two end portions forming the cutting portion a of the first data line 171a, the second data line 171b, and the third data line 171c to each other through the third contact hole 71a1 and the fourth contact hole 71a2.

Similarly, the second connecting member 72a and the third connecting member 70a may be formed together with the same layer as the second conductive layer 1155, 1153, 2155, and 3155 of the display area DA, thereby being made of the same layer as the second conductive layer 1155, 1153, 2155, and 3155.

The second connecting member 72a may be disposed above the fifth contact hole 72a1 and the sixth contact hole 72a2 formed in the first insulating layer 120 and the buffer layer 111, and the second connecting member 72a connects two end portions forming the cutting portion a1 of the driving voltage line 172 to each other through the fifth contact hole 72a1 and the sixth contact hole 72a2. The third connecting member 70a may be disposed above the seventh contact hole 70a1 and the eighth contact hole 70a2 formed in the first insulating layer 120 and the buffer layer 111, and the third connecting member 70a connects two end portions forming the cutting portion a2 of the common voltage line 170 to each other through the seventh contact hole 70a1 and the eighth contact hole 70a2.

According to the display device according to an embodiment, on a plane formed by the intersection of the first direction D1 and the second direction D2, the first data line 171a, the second data line 171b, the third data line 171c, the common voltage line 170, the driving voltage line 172, and the initialization voltage line 173 may include the cutting portions a, a1, and a2 disposed on the region disposed between the display area DA, and the driving voltage transmitting portion 72 and the common voltage transmitting portion 70, two end portions forming the cutting portions a, a1, and a2 of the first data line 171a, the second data line 171b, and the third data line 171c, the common voltage line 170, the driving voltage line 172, and the initialization voltage line 173 may be connected through the first connecting member 71a, the second connecting member 72a, and the third connecting member 70a. Accordingly, the static electricity flowing to the non-display area NDA through the display area DA during the manufacturing process may be dispersed or discharged through the first connecting member 71a, the second connecting member 72a, and the third connecting member 70a, whereby the static electricity may not move to the portion overlapping the driving voltage transmitting portion 72 and the common voltage transmitting portion 70. Accordingly, the static electricity may be prevented from moving to the overlapping portion of the data lines 171a, 171b, and 171c made of the first conductive layer, the driving voltage transmitting portion 72 made of the second conductive layer, and the common voltage transmitting portion 70 made of the third conductive layer, and the short circuit due to the static electricity may be prevented.

Many of the features according to the above-described embodiment may be applicable to other display devices according to various embodiments.

Figure 12:
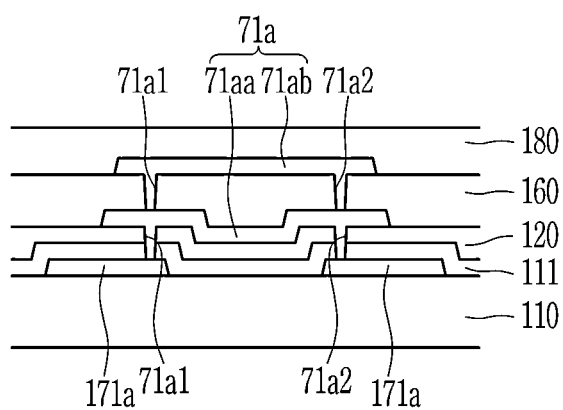
FIG. 12 is a schematic cross-sectional view of a non-display area of a display device taken along line X-X of FIG. 9 according to another embodiment.

The non-display area of the display device according to another embodiment is described with reference to FIG. 12 along with FIG. 9. FIG. 12 is a schematic cross-sectional view of a non-display area of a display device taken along line X-X of FIG. 9 according to another embodiment.

Referring to FIG. 12, the non-display area of the display device according to an embodiment may be similar to the non-display area of the display device according to an embodiment described with reference to FIG. 9 and FIG. 10 above. A detailed description of the same constituent elements is omitted.

Referring to FIG. 12 along with FIG. 9, in the non-display area NDA, the driving voltage transmitting portion 72 and the common voltage transmitting portion 70 extending along the second direction D2 may be disposed on the position overlapping the first data line 171a, the second data line 171b, the third data line 171c, the common voltage line 170, the driving voltage line 172, and the initialization voltage line 173.

On a plane formed by the intersection of the first direction D1 and the second direction D2, the first data line 171a, the second data line 171b, the third data line 171c, the common voltage line 170, the driving voltage line 172, and the initialization voltage line 173 may include the cutting portions a, a1, and a2 disposed at the region disposed between the display area DA, and the driving voltage transmitting portion 72 and the common voltage transmitting portion 70.

Two end portions adjacent to each other of each of the first data line 171a, the second data line 171b, and the third data line 171c separated along the first direction D1 by the cutting portion a of the first data line 171a, the second data line 171b, and the third data line 171c may be connected to each other by the first connecting member 71a.

Similarly, two end portions adjacent to each other of the driving voltage line 172 separated along the first direction D1 by the cutting portion a1 of the driving voltage line 172 may be connected to each other by the second connecting member 72a, and two end portions adjacent to each other of the common voltage line 170 spaced along the first direction D1 by the cutting portion a2 of the common voltage line 170 may be connected to each other by the third connecting member 70a.

However, unlike the display device according to an embodiment described with reference to FIG. 10, the first connecting member 71a of the display device according to an embodiment may be formed together with the same layer as the second conductive layer 1155, 1153, 2155, and 3155 of the display area DA and the third conductive layer 1173, 1154, 2173, 2175, and 3175 of the display area DA, thereby including a lower layer 71aa made of the same layer as the second conductive layer 1155, 1153, 2155, and 3155 of the display area DA and an upper layer 71ab made of the same layer as the third conductive layer 1173, 1154, 2173, 2175, and 3175 of the display area DA. The lower layer 71aa of the first connecting member 71a may be disposed on the third contact hole 71a1 and the fourth contact hole 71a2 formed in the first insulating layer 120 and the buffer layer 111, and the upper layer 71ab of the first connecting member 71a may be disposed on the third contact hole 71a1 and the fourth contact hole 71a2 formed in the second insulating layer 160. The lower layer 71aa and the upper layer 71ab of the first connecting member 71a may connect two end portions forming the cutting portion a of the first data line 171a, the second data line 171b, and the third data line 171c to each other through the third contact hole 71a1 and the fourth contact hole 71a2.

Similarly, the second connecting member 72a and the third connecting member 70a may be formed together with the same layer as the second conductive layer 1155, 1153, 2155, and 3155 of the display area DA and the third conductive layer 1173, 1154, 2173, 2175, and 3175 of the display area DA, thereby including the lower layer made of the same layer as the second conductive layer 1155, 1153, 2155, and 3155 of the display area DA and the upper layer made of the same layer as the third conductive layer 1173, 1154, 2173, 2175, and 3175 of the display area DA.

The lower layer and the upper layer of the second connecting member 72a may be disposed on the fifth contact hole 72a1 and the sixth contact hole 72a2, thereby connecting two end portions forming the cutting portion a1 of the driving voltage line 172 to each other through the fifth contact hole 72a1 and the sixth contact hole 72a2. The lower layer and the upper layer of the third connecting member 70a may be disposed on the seventh contact hole 70a1 and the eighth contact hole 70a2, thereby connecting two end portions forming the cutting portion a2 of the common voltage line 170 to each other through the seventh contact hole 70a1 and the eighth contact hole 70a2.

According to a display device according to an embodiment, on a plane formed by intersecting the first direction D1 and the second direction D2, the first data line 171a, the second data line 171b, the third data line 171c, the common voltage line 170, the driving voltage line 172, and the initialization voltage line 173 may include the cutting portions a, a1, and a2 disposed on the region between the display area DA, and the driving voltage transmitting portion 72 and the common voltage transmitting portion 70, and two end portions forming the cutting portions a, a1 and a2 of the first data line 171a, the second data line 171b, the third data line 171c, the common voltage line 170, the driving voltage line 172, and the initialization voltage line 173 may be connected through the first connecting member 71a, the second connecting member 72a, and the third connecting member 70a. Accordingly, the static electricity flowing to the non-display area NDA through the display area DA during the manufacturing process may be dispersed or discharged through the first connecting member 71a, the second connecting member 72a, and the third connecting member 70a, whereby the static electricity may not move to the portion overlapping the driving voltage transmitting portion 72 and the common voltage transmitting portion 70. Accordingly, the static electricity may be prevented from moving to the overlapping portion of the data line 171a, 171b, and 171c made of the first conductive layer, the driving voltage transmitting portion 72 made of the second conductive layer, and the common voltage transmitting portion 70 made of the third conductive layer, and the short circuit due to the static electricity may be prevented.

Many of the features according to the above-described embodiment may be applicable to other display devices according to various embodiments.

Figure 13:
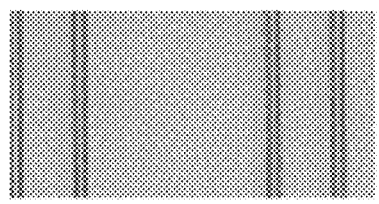
FIG. 13 and FIG. 14 are images schematically showing a result of an experimental example.
Figure 13:
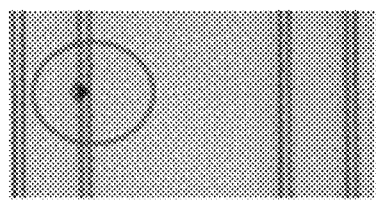
Figure 14:
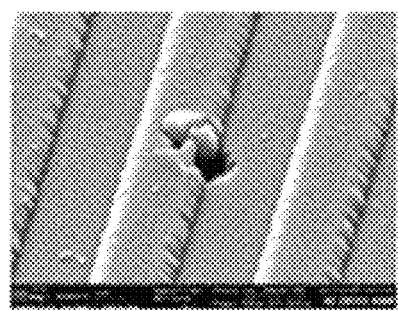
Figure 14:

An experimental example is described with reference to FIG. 13 and FIG. 14. FIG. 13 and FIG. 14 are images schematically showing a result of an experimental example. In the experimental example, like the display device according to an embodiment, in a first case in which the edge portion of the data line may be divided into two end portions through the cutting portion, and the buffer layer, the semiconductor layer, the first insulating layer, the second conductive layer, the second insulating layer, and the third conductive layer may be formed thereon, and a second case in which the data line may be formed to extend from the display area to the non-display area without the cutting portion a like a related art device, and the buffer layer, the semiconductor layer, the first insulating layer, the second conductive layer, the second insulating layer, and the third conductive layer may be formed thereon, and whether the insulating layer was destroyed by static electricity may be observed and a result is shown in FIG. 13. In FIG. 13, (a) shows the first case, and (b) shows the second case. FIG. 14 shows an electron micrograph in the second case.

Referring to FIG. 13, like the display device according to an embodiment, in the first case in which the edge portion of the data line may be divided into two end portions through the cutting portion and the buffer layer, the semiconductor layer, the first insulating layer, the second conductive layer, the second insulating layer, and the third conductive layer may be formed thereon, it may be confirmed that the insulating layer is not destroyed by static electricity.

However, referring to FIG. 13 and FIG. 14, in the second case in which the data line may be formed without the cutting portion a to be extended from the display area to the non-display area like the conventional art, and the buffer layer, the semiconductor layer, the first insulating layer, the second conductive layer, the second insulating layer, and the third conductive layer may be formed, it may be confirmed that the insulating layer is destroyed by the static electricity, thereby causing a short circuit between the first, second, and third conductive layers.

While this disclosure has been made in connection with what is considered to be practical embodiments, it is to be understood that the disclosure is not limited to the disclosed embodiments. On the contrary, it is intended to cover various modifications and equivalent arrangements.

What is claimed is:

1. A display device comprising:
a substrate;
a first conductive layer disposed on the substrate;
a first insulating layer disposed on the first conductive layer;
a semiconductor layer disposed on the first insulating layer;

a second insulating layer disposed on the semiconductor layer;
a second conductive layer disposed on the second insulating layer and overlapping the semiconductor layer;
a third insulating layer disposed on the second conductive layer;
a third conductive layer disposed on the third insulating layer and including a common voltage transmitting portion overlapping the first conductive layer and transmitting a common voltage, wherein
the first conductive layer includes two end portions separated by a region of the first conductive layer,
the two end portions of the first conductive layer are electrically connected by a first connecting part, and
the region is disposed between the semiconductor layer and the common voltage transmitting portion.

2. The display device of claim 1, wherein
the first conductive layer includes a data line and a light blocking pattern overlapping the semiconductor layer, and
the data line includes the two end portions.

3. The display device of claim 2, wherein
the first connecting part is disposed on the third insulating layer,
the first insulating layer, the second insulating layer, and the third insulating layer include a first contact hole and a second contact hole overlapping the two end portions of the first conductive layer, and
the first connecting part is electrically connected to the two end portions of the first conductive layer through the first contact hole and the second contact hole.

4. The display device of claim 2, wherein
the first connecting part is disposed on the second insulating layer,
the first insulating layer and the second insulating layer include a first contact hole and a second contact hole overlapping the two end portions of the first conductive layer, and
the first connecting part is electrically connected to the two end portions of the first conductive layer through the first contact hole and the second contact hole.

5. The display device of claim 2, wherein
the first connecting part includes a lower layer disposed on the second insulating layer and an upper layer disposed on the third insulating layer,
the first insulating layer and the second insulating layer include a first contact hole and a second contact hole overlapping the two end portions of the first conductive layer,
the lower layer of the first connecting part is electrically connected to the two end portions of the first conductive layer through the first contact hole and the second contact hole,
the third insulating layer includes a third contact hole and a fourth contact hole overlapping the two end portions of the first conductive layer, and
the upper layer of the first connecting part is electrically connected to the lower layer of the first connecting part through the third contact hole and the fourth contact hole.

6. The display device of claim 1, wherein
the first conductive layer includes a data line,
the second conductive layer includes a gate electrode overlapping the semiconductor layer, and a driving voltage transmitting portion overlapping the data line and transmitting a driving voltage, and
the region is disposed between the semiconductor layer and the driving voltage transmitting portion.

7. The display device of claim 1, wherein the common voltage transmitting portion overlaps the driving voltage transmitting portion.

8. The display device of claim 7, wherein
the first connecting part is disposed on the third insulating layer,
the first insulating layer, the second insulating layer, and the third insulating layer include a first contact hole and a second contact hole overlapping the two end portions of the first conductive layer, and
the first connecting part is electrically connected to the two end portions of the first conductive layer through the first contact hole and the second contact hole.

9. The display device of claim 7, wherein
the first connecting part is disposed on the second insulating layer,
the first insulating layer and the second insulating layer include a first contact hole and a second contact hole overlapping the two end portions of the first conductive layer, and
the first connecting part is electrically connected to the two end portions of the first conductive layer through the first contact hole and the second contact hole.

10. The display device of claim 7, wherein
the first connecting part includes a lower layer disposed on the second insulating layer and an upper layer disposed on the third insulating layer,
the first insulating layer and the second insulating layer include a first contact hole and a second contact hole overlapping the two end portions of the first conductive layer,
the lower layer of the first connecting part is electrically connected to the two end portions of the first conductive layer through the first contact hole and the second contact hole,
the third insulating layer includes a third contact hole and a fourth contact hole overlapping the two end portions of the first conductive layer, and
the upper layer of the first connecting part is electrically connected to the lower layer of the first connecting part through the third contact hole and the fourth contact hole.

11. The display device of claim 7, wherein
the first conductive layer further includes a driving voltage line, and
the driving voltage transmitting portion is electrically connected to the driving voltage line.

12. The display device of claim 11, wherein
the first conductive layer further includes a common voltage line, and
the common voltage transmitting portion is electrically connected to the common voltage line.

13. The display device of claim 2, wherein
the first conductive layer further includes a driving voltage line and an initialization voltage line,
the semiconductor layer includes:
a semiconductor layer of a driving transistor electrically connected to the driving voltage line;
a semiconductor layer of a switching transistor electrically connected to the data line; and
a semiconductor layer of an initialization transistor electrically connected to the initialization voltage line, and
the second conductive layer includes:
a gate electrode of the driving transistor overlapping the semiconductor layer of the driving transistor; and a lower storage electrode extended from the gate electrode of the driving transistor and electrically connected to the semiconductor layer of the switching transistor.

14. A display device comprising:
a substrate including a display area and a non-display area, the non-display area disposed around the display area;
a first conductive layer disposed on the substrate and disposed in the display area and the non-display area;
a first insulating layer disposed on the first conductive layer;
a semiconductor layer disposed on the first insulating layer and disposed in the display area;
a second insulating layer disposed on the first insulating layer and the semiconductor layer;
a second conductive layer disposed on the second insulating layer and overlapping the semiconductor layer;
a third insulating layer disposed on the second conductive layer; and
a third conductive layer disposed on the third insulating layer and including a common voltage transmitting portion overlapping the first conductive layer and transmitting a common voltage, wherein
the first conductive layer includes two end portions separated by a cutting portion disposed in the non-display area,
the two end portions of the first conductive layer are electrically connected by a first connecting part,
the cutting portion of the first conductive layer is disposed between the semiconductor layer and a driving voltage transmitting portion, and
the cutting portion of the first conductive layer is disposed between the semiconductor layer and the common voltage transmitting portion.

15. The display device of claim 14, wherein
the first conductive layer includes a light blocking film and a data line,
the second conductive layer includes:
a gate electrode overlapping the semiconductor layer; and
a driving voltage transmitting portion overlapping the data line disposed in the non-display area, the driving voltage transmitting portion transmitting a driving voltage.

16. The display device of claim 15, wherein the common voltage transmitting portion overlaps the driving voltage transmitting portion.

17. The display device of claim 16, wherein
the first connecting part is disposed on the third insulating layer,
the first insulating layer, the second insulating layer, and the third insulating layer include a first contact hole and a second contact hole overlapping the two end portions of the first conductive layer, and
the first connecting part is electrically connected to the two end portions of the first conductive layer through the first contact hole and the second contact hole.

18. The display device of claim 16, wherein
the first connecting part is disposed on the second insulating layer,
the first insulating layer and the second insulating layer include a first contact hole and a second contact hole overlapping the two end portions of the first conductive layer, and
the first connecting part is electrically connected to the two end portions of the first conductive layer through the first contact hole and the second contact hole.

19. The display device of claim 16, wherein
the first connecting part includes a lower layer disposed on the second insulating layer and an upper layer disposed on the third insulating layer,
the first insulating layer and the second insulating layer include a first contact hole and a second contact hole overlapping the two end portions of the first conductive layer,
the lower layer of the first connecting part is electrically connected to the two end portions of the first conductive layer through the first contact hole and the second contact hole,
the third insulating layer includes a third contact hole and a fourth contact hole overlapping the two end portions of the first conductive layer, and
the upper layer of the first connecting part is electrically connected to the lower layer of the first connecting part through the third contact hole and the fourth contact hole.

* * * * *